United States Patent [19]
Lee et al.

[11] Patent Number: 6,108,233
[45] Date of Patent: Aug. 22, 2000

[54] ULTRA LOW VOLTAGE STATIC RAM MEMORY CELL

[75] Inventors: Hyun Lee, Allentown; Mark Yeen Luong, Macungie, both of Pa.

[73] Assignee: Lucent Technologies Inc., Murray Hill, N.J.

[21] Appl. No.: 09/384,346

[22] Filed: Aug. 27, 1999

[51] Int. Cl.$^7$ .................................................... G11C 11/00
[52] U.S. Cl. ............................................ 365/154; 365/156
[58] Field of Search .................................... 365/154, 156, 365/190, 203

[56] References Cited

U.S. PATENT DOCUMENTS

| | | | |
|---|---|---|---|
| 5,325,325 | 6/1994 | Azuma ...................................... | 365/156 |
| 5,590,087 | 12/1996 | Chung et al. ....................... | 365/230.05 |
| 5,764,564 | 6/1998 | Frake et al. .............................. | 365/154 |
| 5,877,979 | 3/1999 | Li et al. .................................... | 365/154 |
| 5,894,432 | 4/1999 | Lotfi ........................................ | 365/154 |

*Primary Examiner*—Son Mai
*Attorney, Agent, or Firm*—Duane, Morris & Heckscher LLP

[57] ABSTRACT

An integrated circuit includes a memory cell that stores a data bit corresponding to one of a low and a high voltage. A memory element is coupled to a data node for storing the data bit and to an inverse data node for storing an inverse of the data bit. An access port of the memory cell comprises an access switch having a first terminal coupled to a data line, a second terminal coupled to the data node, and a control terminal coupled to an access control line which provides an access control signal for switching the access switch on or off to selectively couple the data line to the data node. The memory cell has a preset switch having a first terminal coupled to the inverse data node, a second terminal coupled to a logic-0 voltage source, and a preset control terminal coupled to a preset control line which provides a write preset control signal for switching the preset switch on or off to selectively couple the inverse data node to the logic-0 voltage source.

20 Claims, 4 Drawing Sheets

300
WPRE = (WR * PWL * PRE)

WPRE = (WR * PWL * PRE)

400

510

550

ULTRA LOW VOLTAGE STATIC RAM MEMORY CELL

CROSS-REFERENCES TO RELATED APPLICATIONS

This Application is related to commonly-owned U.S. patent application Ser. No. 09/291,158, entitled "MULTI-PORT MEMORY CELL WITH PRESET," filed Apr. 12, 1999, the entirety of which is incorporated herein by reference.

BACKGROUND OF THE INVENTION

1. Field of the Invention

The present invention relates to memory cells and, in particular, to ultra low voltage operated static RAM (SRAM) memory cells.

2. Description of the Related Art

Computer memory cells are in wide use today. They may be used, for example, in various forms of random-access memory (RAM), in registers, and other devices. Each memory cell stores a bit of data, i.e. a binary 0 (logic low, typically $V_{SS}$ or ground) or 1 (logic high, typically $V_{DD}$). New data may be written into the cell, and stored data may be read from the cell. In a memory array of such cells, a row of memory cells is typically used to provide storage of larger, multi-bit units of data such as bytes or words. A given row can be used to provide one word or several words. The memory array can provide a number of rows to provide multiple word storage.

Referring now to FIG. 1, there is shown a circuit diagram illustrating a prior art memory cell 100. Memory cell 100 is a conventional 6-T (six-transistor) SRAM cell comprises a flip-flop or memory element comprising inverters 101, 102, which may be implemented with two transistors each (one nmos and one pmos transistor). The flip-flop has data node D and inverse-data node DN (data-not, the inverse of D). Data node D stores a 1 or 0 corresponding to the data stored in memory cell 100.

Cell 100 comprises a data access port such as the data access port illustrated in FIG. 1, which allows a single external device or component such as a processor to write or read a bit to the cell, at a given time. The data access port can be used as a write-access port or as a read-access port. The data access port of cell 100 comprises umos access transistors 105, 106, plus three input lines for the three signals BIT, $\overline{\text{BIT}}$, and WL (WordLine), for purposes of writing a bit to or reading a bit from memory cell 100, from or to a single external device such as a processor. The memory cells of a given column of an array of memory cells typically share the same data access ports. FIG. 2 is a block diagram of a memory cell system or array 200 employing conventional SRAM memory cells such as cell 100.

Cell 100 may be powered by a power supply voltage of, say, $V_{DD}$=3V. Nmos transistors such as transistors 105, 106 have a typical threshold drop of approximately 0.6V. Due to the threshold voltage of access transistor 105, the input signal on a single input line BIT may not be strong enough to write a 1 quickly enough, or even at all. For example, if cell 100 previously stored a 0 so that data node D was 0V, and a 1 is to be written to the cell by input line BIT, then a 1 (3V) on line BIT causes node D to raise from 0V to only 2.4V, because of the voltage drop of 0.6V across transistor 105. Increasing node D to 2.4V may be too low to quickly raise the cell to a 1 state from a 0 state, because it may be slow to overcome the current 0 state of the cell.

Even worse, with even lower supply voltages such as 1.2V, node D would only be raised to 0.6V, which is insufficient to guarantee that node D is pulled high quickly enough or even at all. With smaller and smaller supply voltages, because of the voltage drop of the access transistor of the data access port, a single input line is unable, in the prior art, to override the previous 0 state to write a 1 state.

Thus, two input lines, BIT and $\overline{\text{BIT}}$, are typically used to store the signal provided by the BIT line in a memory cell such as cell 100. To store a value in cell 100, signal WL goes high, and BIT provides the signal to be stored, while $\overline{\text{BIT}}$ provides the inverse of the BIT signal. In the case where D was is 0 from the previous memory state, and BIT carries a 1 (1.2V) to be stored in cell 100, $\overline{\text{BIT}}$ is 0V and so is node DN, because there is no voltage drop across transistor 106 when $\overline{\text{BIT}}$ is 0. A 0 or low signal at the input to inverter 102 causes inverter 102 to bring node D quickly up to 1. Thus, each write-access port requires two access transistors such as transistors 105, 106 plus four input lines carrying three input signals. For a write operation, the BIT signal is derived from the data signal provided by the processor writing into the cell. The $\overline{\text{BIT}}$ signal is provided by an inverter external to the memory cell array. The WL signal is provided by memory control logic which itself receives address information from the processor.

Similarly, the data access port may be used as a read-access port. In this case access transistors 105, 106 serve as read-access transistors. To read the state or bit of cell 100, an output line coupled to each of the BIT and BIT terminals has to be precharged. Then, the read-access transistors 105, 106 are turned on, allowing the cell to discharge one of the two precharged lines, depending on whether the cell is high or low. When a line is discharged, external circuitry can detect this and thus will be able to tell whether the memory cell 100 has a 0 or 1 stored therein.

A dynamic RAM (DRAM) type memory cell comprises a capacitor and a transistor. The capacitor tends to lose data unless it is recharged often, e.g. once every few milliseconds. This recharging tends to slow down the performance of DRAM compared to other types of RAM. A static RAM (SRAM) memory cell stores a data bit in a capacitor that does not require constant recharging to retain data. Thus, SRAM performs better than DRAM because it does not need to be constantly recharged. For example, the typical access time for an SRAM is three to four times faster than that for a DRAM. SRAM is often used for secondary caches because its speed falls somewhere between that of DRAMs and a CPU-based cache.

It is desirable to be able to operate memory cells, such as SRAM cells, at very low voltages (sometimes referred to as ultra low voltages), e.g. <0.9V. Previous attempts to achieve low voltage operation SRAM cells utilize either low $V_t$ (threshold voltage) processing and/or a vers specialized sense-amp. However, the low $V_t$ design typically causes cell stability and sub-threshold leakage problems. A specialized sense-amp is typically a custom-designed circuit which is not easily transferable from one technology to another, and it normally imposes very strict operating conditions. Accordingly, it is desirable to operate SRAM cells at ultra low voltages, without using a low $V_t$ processing, with very low power dissipation, and with a read-write access time comparable to that achieved in memory cells operated at a high voltage (e.g., >2.5V).

SUMMARY

An integrated circuit includes a memory cell that stores a data bit corresponding to one of a low and a high voltage. A memory element is coupled to a data node for storing the data bit and to an inverse data node for storing an inverse of the data bit. An access port of the memory cell comprises an access switch having a first terminal coupled to a data line, a second terminal coupled to the data node, and a control terminal coupled to an access control line which provides an access control signal for switching the access switch on or off to selectively couple the data line to the data node. The memory cell has a preset switch having a first terminal coupled to the inverse data node, a second terminal coupled to a logic-0 voltage source, and a preset control terminal coupled to a preset control line which provides a write preset control signal for switching the preset switch on or off to selectively couple the inverse data node to the logic-0 voltage source.

DESCRIPTION OF THE PREFERRED EMBODIMENT

Figure 1:
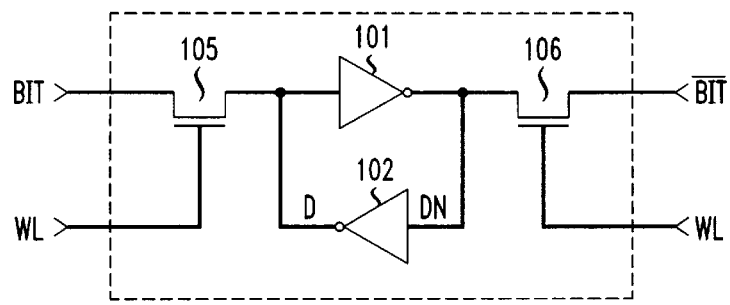
FIG. 1 is a circuit diagram illustrating a prior art memory cell.
Figure 2:
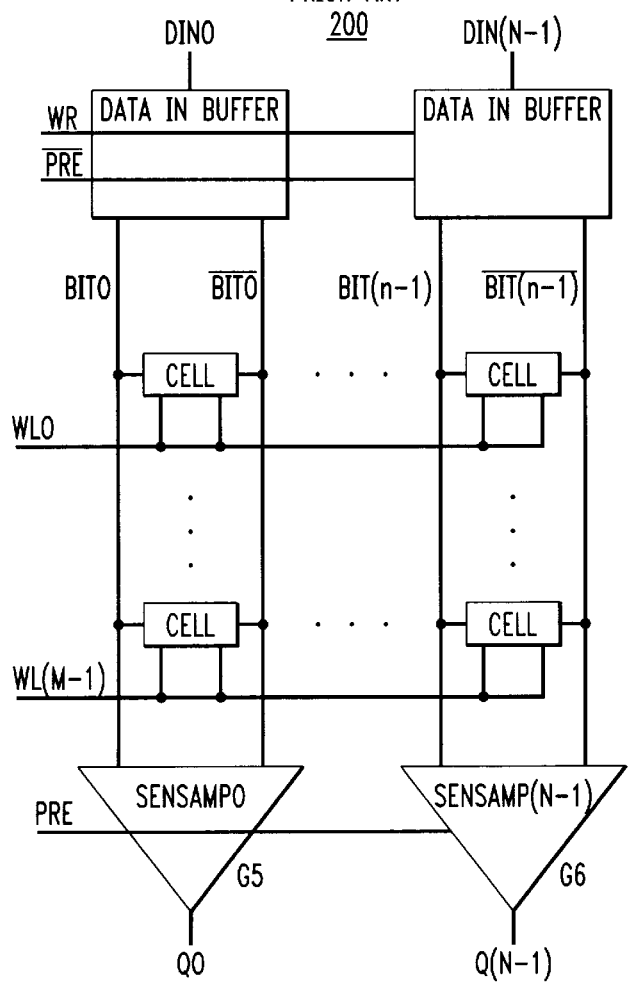
FIG. 2 is a block diagram of a memory cell system employing conventional memory cells such as the prior art memory cell of FIG. 1.
Figure 3A:
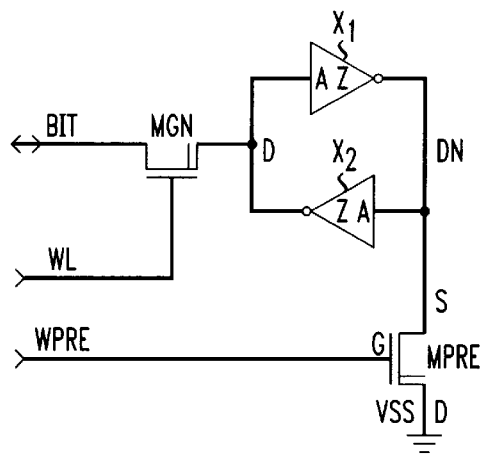
FIGS. 3A–B are circuit diagrams illustrating an ultra low voltage SRAM cell, in accordance with an embodiment of the present invention.
Figure 3B:
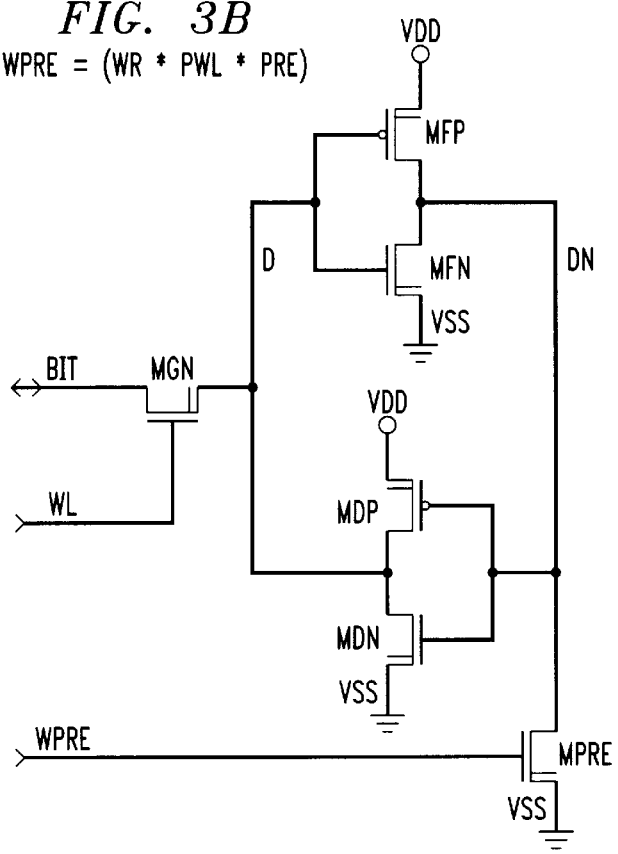

Referring now to FIGS. 3A–B, there are shown circuit diagrams illustrating an ultra low voltage SRAM cell 300, in accordance with an embodiment of the present invention. FIG. 3A shows SRAM cell 300 with inverters $X_1$, $X_2$. FIG. 3B shows SRAM cell 300 with transistors $M_{FP}$ and $M_{FN}$, which constitute inverter $X_1$, and transistors $M_{DP}$, $M_{DN}$, which constitute inverter $X_2$. In the present invention, as explained in further detail below, prior to a write-access to the memory cell, during a pre-write period, the cell is pre-written with logic-1 (high) through an internal preset transistor $M_{PRE}$. Thus, the actual cell write can be done by either discharging the pre-written cell node (in case of writing 0 to the cell) or leave the cell as is (in the case of writing 1 to the cell).

In an embodiment, each memory cell of a memory array or system is configured identically to memory cell 300. SRAM cell 300 comprises a flip-flop or memory element comprising inverters $X_1$, $X_2$. The flip-flop has data node D and inverse-data node DN (data-not, the inverse of D). Data node D stores a 1 or 0 corresponding to the data stored in memory cell 100. SRAM cell 300 also comprises a single data access port rather than two access ports as in conventional cell 100. The (bidirectional) data access port may be used by an external device or component such as a processor to write or read a bit to or from the cell. A preset transistor is used so that a single-transistor access port suffices for write and reads, as described in further detail below.

Figure 4:
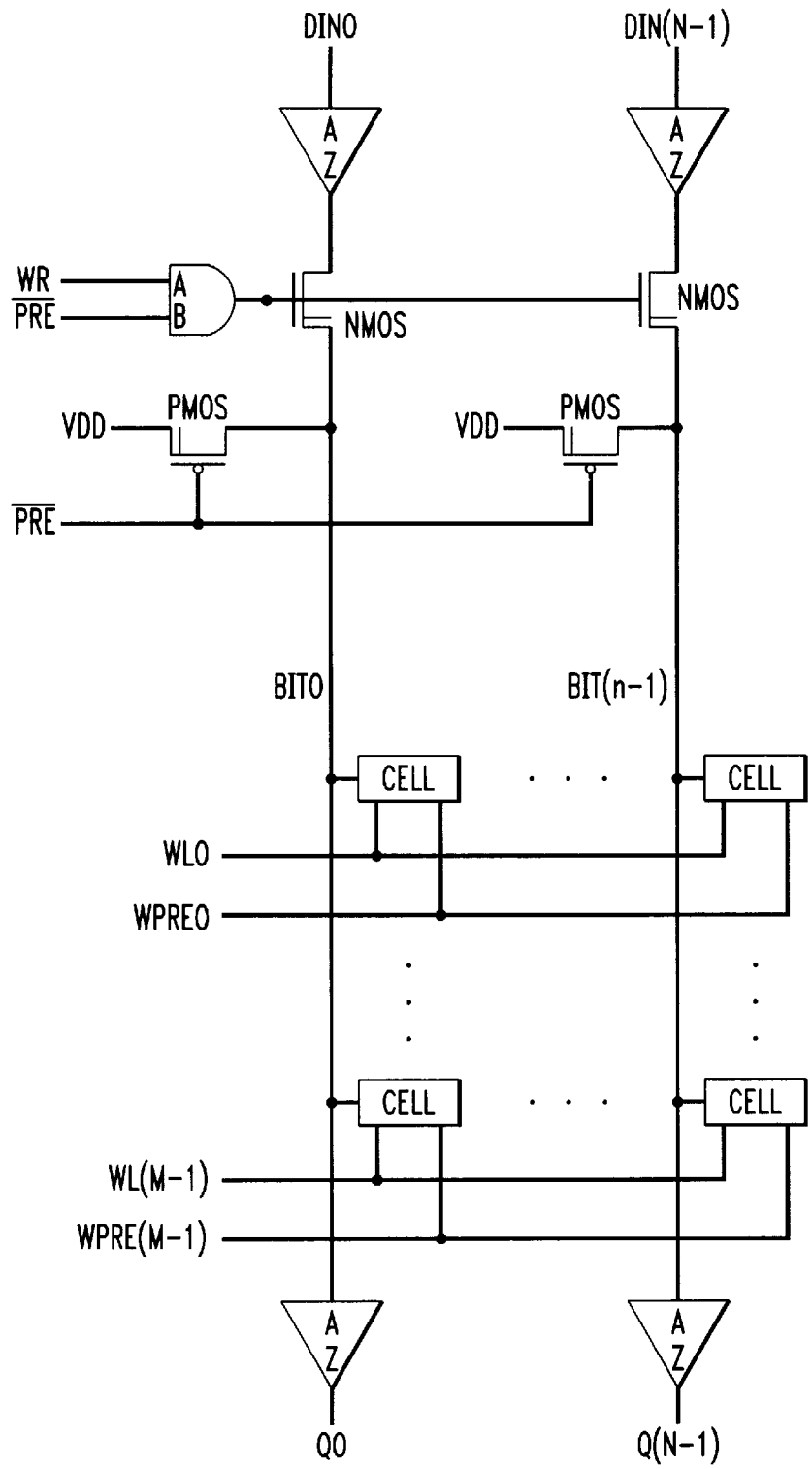
FIG. 4 is a block diagram of a memory cell system using the SRAM cell of FIG. 3, in accordance with an embodiment of the present invention.

Referring now to FIG. 4, there is shown a block diagram of a memory cell system 400 using a plurality of SRAM cells, each identical to SRAM cell 300 of FIG. 3, in accordance with an embodiment of the present invention. Memory array 400 may be implemented as an integrated circuit (IC).

Referring once more to FIGS. 3A–B, SRAM cell 300 comprises six transistors: two pmos ($M_{FP}$, $M_{DP}$) and four nmos ($M_{GN}$, $M_{PRE}$, $M_{FN}$, and $M_{DN}$). Conventional 6-T SRAM cell 100 also comprises six transistors. However, the electrical connection to one of the access transistors ($M_{PRE}$) is different in cell 300 than in prior art cell 100 (106).

In prior art cell 100, a pair of nmos access transistors 105, 106 are required, along with separate BIT and $\overline{BIT}$ lines. As explained previously, the pair of access transistors are used to ensure that new data to be written can change the state of the cell, if necessary. In cell 300, by contrast, there is only one access transistor ($M_{GN}$) which is coupled only to the BIT line; the $\overline{BIT}$ line is not required. Unlike prior art cell 100, cell 300 employs, in addition to the bidirectional data access port, a pre-write or preset transistor $M_{PRE}$. This preset transistor $M_{PRE}$ functions as a switch having a first (drain) terminal coupled to ground, a second (source) terminal coupled to inverse data node DN, and a gate (or preset switch control) terminal coupled to write preset control signal WPRE.

Thus, the write preset control signal WPRE coupled to the preset gate (switch control terminal) of transistor or switch $M_{PRE}$ serves to switch the preset transistor or switch on or off, so that node DN is coupled directly to ground ($V_{SS}$) when WPRE goes high. WPRE is a logic AND function of WR, PWL, and PRE. WR is the WRITE signal, PWL is the Pre-decoded WordLine signal, and PRE may be a buffered CK (clock) signal. WL is a logic AND function of the PWL and $\overline{PRE}$ signals. During the write preset (pre-write) phase, DN is coupled directly to ground ($V_{SS}$) by way of preset switch $M_{PRE}$, so that node DN is brought low because it is coupled to $V_{SS}$.

Whether the drain terminal is coupled directly to ground or $V_{SS}$, the ground or $V_{SS}$ source to which the drain terminal is coupled serves as a logic-0 voltage source because it pulls node DN to a logic-0 state. This causes node D to be pre-charged to a logic-i state, so that SRAM cell 300 is pre-written with a logic-1. Because cell 300 is pre-written with a logic-1 prior to any write operation, a single write terminal can be used to write the new data bit to the cell; if a logic-0 is to be written, node D simply discharges, and if a logic-1 is to be written, the cell state does not change. Thus, there is no danger that a logic-1 on the BIT line will be too weak to raise a stored logic-0 to a 1, because the preset or pre-write phase ensures that a logic-1 is first written to the cell before any write operation.

The physical sizes of the transistors of cell 300 may be selected to reduce read/write access time and to enhance the data integrity in the cell. Transistors $M_{FP}$, $M_{FN}$ are designed to be very weak feedback transistors such that it enhances the stability of cell data during a read operation. The nmos transistor $M_{DN}$ is sized to be a strong device to reduce the bit line discharge time during a read operation. The pmos transistor $M_{DP}$ is sized to be weak, thus, during the pre-write period, it can pull node D to high ($V_{DD}$) relatively easily, but it does not fight the BIT line driver when the cell is to be written with 0.

Figure 5A:
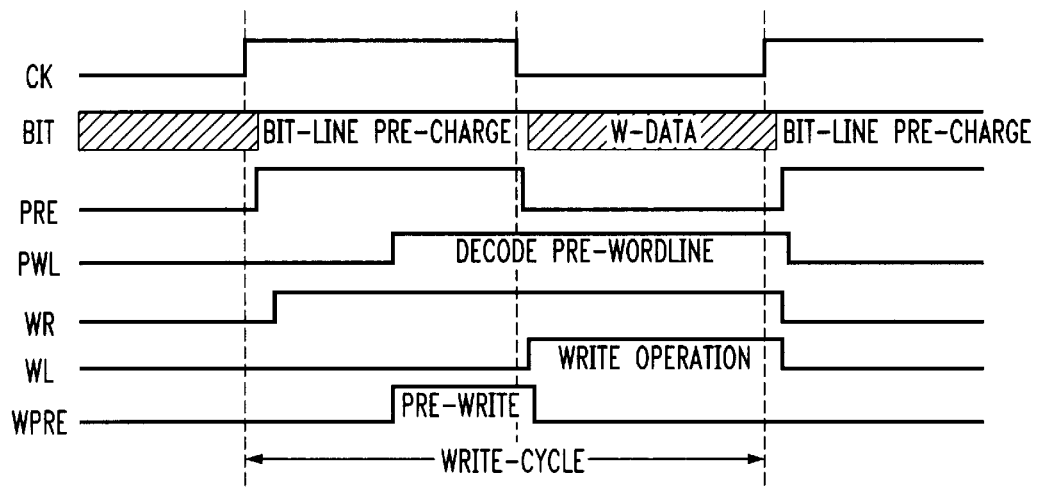
FIGS. 5A–B are timing diagrams illustrating the write- and read-cycles of the SRAM cell of FIGS. 3A–B.

Referring now to FIG. 5A, there is shown a timing diagram 510 illustrating the write-cycle of SRAM cell 300. To perform a write operation, the WR signal is held high and a cell write is then accomplished in two phases: a cell pre-write phase (while CK=1), and a cell write 30 phase (while CK=0). During the cell pre-write phase, CK=1, and the word line WL is held low and the access transistor $M_{GN}$ is thus off, and all BIT lines are pre-charged to logic-one with the $\overline{PRE}$ signal. If a particular row is selected for a write, the preset control signal WPRE is activated and turns on the preset transistor $M_{PRE}$. This grounds terminal DN, thereby causing the cell to be pre-written with logic 1 at node D.

During the cell write phase, CK=0, the pre-write signal WPRE is off, and the write-access transistor $M_{GN}$ is on (because WL is high). The preset transistor $M_{PRE}$ is off because WPRE is low during this phase; this causes node DN to be isolated from the ground node. The data bit to be written is applied to the BIT line during this phase. If the data bit is logic-zero ($V_{SS}$), the data node D is discharged to $V_{SS}$ through the nmos access transistor $M_{GN}$. If, however, the data bit is logic-one ($V_{DD}$, high), the data node D and data-not node DN in the cell 300 does not change.

During write mode, access transistor $M_{GN}$ therefore functions as a write-access switch having an input terminal (coupled to the input data bit on the bidirectional BIT line), an output terminal coupled to node D, and a gate (or switch control) terminal coupled to WordLine WL.

During read mode (described below with reference to FIG. 5B), access transistor $M_{GN}$ functions as a switch having an input terminal (coupled to the stored bit at node D), an output terminal coupled to the bidirectional BIT line, and a gate (or switch control) terminal coupled to WordLine WL. Thus, in both read and write mode, the WL signal coupled to the gate terminal serves to switch the access transistor or switch $M_{GN}$ on or off, thereby coupling node D to the BIT line. The WL signal may thus be considered to be an access control signal.

The preset transistor $M_{PRE}$ thus allows the cell to be written with a single access transistor $M_{GN}$, and all cell writes are done either by clearing the pre-written 1 or by leaving the pre-written 1 as is. The present invention therefore eliminates the need of having both bit lines (BIT/$\overline{BIT}$) for write operations, and allows the memory to be operated at a very low voltage ($\leq 0.9V$) without either increasing the transistor count per cell or the write access time. An SRAM cell in accordance with the present invention may also be configured to operate at operating voltages even lower than 0.9V; or at operating voltages even higher than 5V.

In addition, the present invention can reduce the power dissipation relative to a conventional 6-T cell by reducing the number of data-input buffers by half. Another advantage of the present invention is that, since a cell cannot be written by forcing 1 on the BIT line, the overlapping of signals PRE and WL (PRE active to WL inactive) does not need to be controlled as precisely as in a conventional SRAM cell such as cell 100.

Figure 5B:
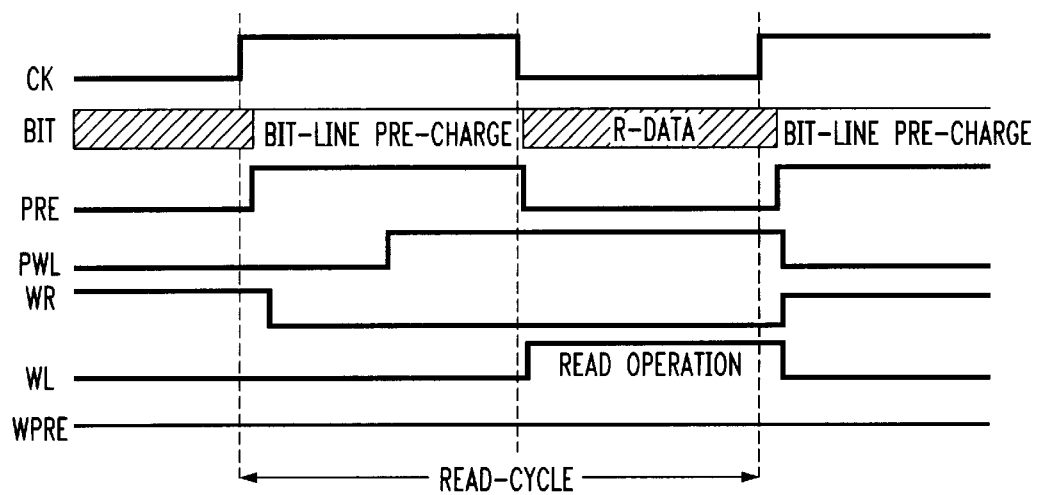

Referring now to FIG. 5B, there is shown a timing diagram 550 illustrating the read-cycle of SRAM cell 300. To perform a read operation, the WR signal is held low and a cell read is then accomplished in two phases: a read line preset phase (while CK=1), and a cell read phase (while CK=0). During the read line preset phase, CK=1, and the word line WL is held low, so that the access transistor $M_{GN}$ is off; WPRE remains low during the entire read operation, so that preset transistor $M_{PRE}$ remains off; and all BIT lines are pre-charged to logic-one with the $\overline{PRE}$ signal.

During the cell read phase, CK=0, the bit line pre-charge is off, and the access transistors $M_{GN}$ on a selected row of cells turn on for a read access by switching WL high. The BIT line discharges to logic-zero ($V_{SS}$) only when the cell was previously written with a zero. The output Q ($Q_0$-$Q_{N-1}$, as shown in memory cell array 300 of FIG. 3) can be produced via an inverting/non-inverting buffer ($G_3$, $G_4$ of FIG. 3). The read-access time of cell 300 is not any slower than a conventional SRAM cell such as cell 100, but the power dissipation is much less than a conventional SRAM which needs to pre-charge both BIT/$\overline{BIT}$ lines and always needs to discharge one of these lines for a read operation.

The present invention also reduces capacitance and power dissipation on the WL lines, because the total gate capacitance due to cell access transistor $M_{GN}$ is half that of a conventional SRAM cell 100. In addition, because the total gate capacitance on the WordLine is smaller, the physical size of the WordLine driver can be much smaller. This also leads to a smaller physical size of the cell and associated circuitry such as the WL driver.

Another reason the overall size of cell 300 is smaller than previous designs is that no conventional sense-amps are needed. Because there are no $\overline{BIT}$ lines, a simple inverter-buffer may be employed instead. In addition, a simple inverter can be used as a BIT line driver, instead of more complicated circuitry designed to generate both BIT/$\overline{BIT}$ signals from input data.

Moreover, ultra low voltage operation is achieved. The minimum operating voltage is $V_{MINOP} \approx MAX[V_{tn}, V_{tp}] + \Delta V$, where $\Delta V$ is a voltage value to overdrive the circuit for speed reasons. Since all active read/write operations are conducted by detecting logic-0 (0V or $V_{SS}$), and since it does not require a sense-amp, a memory array or system employing a plurality of SRAM cells 300 can operate with a supply (and thus logic-1) voltage as low as $V_{MINOP}$. The ultra low voltage operation also contributes to there being smaller power dissipation, and also reduces the noise coupling into the cell to better preserve cell data. Since the magnitude of voltage swing is very small, dV/dt is also very small (for the same BIT and WL rise/fall time). Thus, it is less likely to corrupt the cell data during a cell access.

The SRAM cell of the present invention also has enhanced cell access time. First, there is less RC delay time on the WordLine. Apart from power savings, the RC time constant on the WordLine is smaller than that in conventional cell 100, due to less WordLine capacitance. Also, because increasing the size of nmos transistor $M_{DN}$ has a negligible impact on the write-access time (the increase of source capacitance of $M_{DN}$ over the total BIT line capacitance is negligible) and has no impact on WordLine delay time (there is no connection between WordLine and $M_{DN}$), $M_{DN}$ can be increased to reduce read-access time without increasing write-access time (which is not the case for a conventional 6-T SRAM cell 100). Thus, for read access, there can be a faster BIT line discharge with little tradeoff.

There are also several reasons why SRAM cell 300 enhances data integrity. First, since only one access port is required, the cross-couple inverters (101, 102) do not have to be identical, i.e. there can be mismatch. (By contrast, mismatch can be problematic in conventional SRAM cell 100 and thus the inverters 101, 102 of cell 100 must be nearly identical.) Thus, this allows proper sizing of $M_{FP}$, $M_{FN}$, $M_{DP}$, and $M_{DN}$, and reduction of any cell disturbance which is caused by the noise coupled into node D from the BIT line and WordLine.

A second reason why SRAM cell 300 enhances data integrity is that, during a read-access after the pre-charge phase, the voltage on node D could go up as the access transistor $M_{GN}$ turns on, and the amount of voltage swing upward on node D is decided by the ratio of transistor sizes of $M_{GN}$ and $M_{DN}$ because they are both conducting when the data stored on node DN is logic-one. In this case, the maximum upward swing of the node voltage on D is approximately given by the following equation (ignoring secondary effects such as coupling, parasitic, back-gate bias effect, and wire resistance, etc.):

$$V_{NODE-D}=V_{DD}*Z(M_{DN})/\{Z(M_{DN})+Z(M_{GN})\},$$

where $Z(M_{DN})$ and $Z(M_{GN})$ are the effective "on"-impedances of nmos transistors $M_{DN}$ and $M_{GN}$, respectively. In practice, the maximum upward swinging voltage on node D is far less than the computed value. In any event, a desired level of data integrity can be ensured by simply choosing a ratio of $M_{DN}$ to $M_{GN}$. For example, for $V_{DD}$=1.5V, the upward swing of node D can be limited to less than 0.5V by selecting the ratio of the transistors $M_{DN}/M_{GN}$=2. This provides yet another advantage over conventional SRAM cell 100, which cannot vary the nmos transistors of inverters 101 and 102 without affecting both read- and write-access time.

A third reason why SRAM cell 300 enhances data integrity is that, with $V_{DD} \approx MAX[V_{tp}, V_{tn}]$, the upward swing voltage on node D is limited to $V_{DD}-V_{tn}$ when $M_{GN}$ turns on. This is because the maximum WordLine voltage is $MAX[V_{tp}, V_{tn}]$, and there is a $V_{tn}$ drop from the gate of $M_{GN}$ to node D. Thus, as the operating voltage drops closer to the threshold voltage of the transistors, the dat in cell 300 becomes more stable. This is another advantage over a conventional SRAM cell 100 which becomes less stable (during a read-access) as the operating voltage drops.

In an alternative embodiment, preset transistor $M_{PRE}$ is a pmos transistor and is coupled between $V_{DD}$ and node D, instead of between ground (low) and node DN. Its gate is coupled to the inverse of write preset control signal WPRE, i.e. $\overline{WPRE}$. This allows node D to be raised directly to high when the write preset control signal goes high, in the memory cell preset phase. In either embodiment, preset transistor $M_{PRE}$ is used to preset the memory cell to the logic-1 (high) state.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit having a memory cell for storing a data bit corresponding to one of a low and a high voltage, comprising:

(a) a memory element coupled to a data node for storing the data bit and to an inverse data node for storing an inverse of the data bit;

(b) a single-ended, bidirectional access port comprising only one access switch having a first terminal coupled to a data line, a second terminal coupled to the data node, and a control terminal coupled to an access control line which provides an access control signal for switching the access switch on or off to selectively couple the data line to the data node to either write a write-data bit to the memory cell in a write phase, or to read a read-data bit from the memory cell, in a read phase; and (c) a preset switch having a first terminal coupled to one of the data node and the inverse data node, a second terminal coupled to one of a logic-1 voltage source and a logic-0 voltage source, respectively, and a preset control terminal coupled to a preset control line which provides a write preset control signal that switches the preset switch on to couple the first terminal of the preset switch to the second terminal of the preset switch, before each write of a write-data bit to the memory cell via the access port, to precharge the data node to the high voltage before writing the write-data bit to the memory cell.

2. The integrated circuit of claim 1, wherein the first terminal of the preset switch is coupled to the inverse data node and the second terminal of the preset switch is coupled to a logic-0 voltage source.

3. The integrated circuit of claim 2, wherein:

the access switch of the access port is an nmos access transistor;

the control terminal of the access transistor is an access transistor gate terminal;

the preset switch is an nmos preset transistor; and the preset control terminal of the preset transistor is a preset transistor gate terminal.

4. The integrated circuit of claim 1, wherein the memory element comprises a first inverter coupled at an input terminal to the data node and at an output terminal to the inverse data node and a second inverter coupled at an input terminal to the inverse data node and at an output terminal to the data node.

5. The integrated circuit of claim 4, wherein:

the first inverter comprises a first pmos transistor and a first nmos transistor and the second inverter comprises a second pmos transistor and a second nmos transistor;

and the sizes of the first nmos and pmos transistors and second nmos and pmos transistors are selected to reduce read/write access time and to enhance data integrity in the memory cell.

6. The integrated circuit of claim 4, wherein:

the first inverter comprises a first pmos transistor and a first nmos transistor and the second inverter comprises a second pmos transistor and a second nmos transistor;

the first pmos transistor and the first nmos transistor are sized to be very weak feedback transistors to enhance the stability of cell data during a read operation;

the second pmos transistor is sized to be weak so that, during a pre-write phase, it can pull the first node to logic-1 but does not oppose a logic-0 to be written to the data line; and the second nmos transistor is sized to be a strong device to reduce data line discharge time during a read operation.

7. The integrated circuit of claim 1, wherein the memory cell operates using a logic-1 voltage $\leq 0.9V$.

8. The integrated circuit of claim 1, wherein the logic-0 voltage source is one of ground and $V_{SS}$.

9. In an integrated circuit comprising a memory cell having a memory element coupled to a data node for storing a data bit corresponding to one of a low and a high voltage and coupled to an inverse data node for storing an inverse of the data bit, a method for writing a write-data bit to the memory cell, the method comprising the steps of:

(a) before every write of a write-data bit to the memory cell during a cell write phase, precharging, during a cell pre-write phase prior to each said cell write phase, the data node to the high voltage, wherein the memory cell comprises a single-ended, bidirectional access port having only one access switch, the access switch having a first terminal, a second terminal coupled to the data node, and a control terminal;

(b) during the cell write phase, providing the data bit to the first terminal of the access switch and providing an access control signal to a control terminal of the access switch to couple the first terminal of the access switch to the data node to write the write-data bit to the precharged data node.

10. The method of claim 9, wherein:

step (a) comprises the step of coupling the inverse data node to a logic-0 voltage source, to cause the data node to store a logic-1 data bit, with a preset switch having a first terminal coupled to the inverse data node, a second terminal coupled to the logic-0 voltage source, and a preset control terminal coupled to a preset control line which provides a write preset control signal for switching the preset switch on or off to selectively couple the inverse data node to the logic-0 voltage source.

11. The method of claim 9, wherein:

the access switch of the access port is an nmos access transistor;

the control terminal of the access transistor is an access transistor gate terminal;

the preset switch is an nmos preset transistor; and the preset control terminal of the preset transistor is a preset transistor gate terminal.

12. The method of claim 9, wherein the memory element comprises a first inverter coupled at an input terminal to the data node and at an output terminal to the inverse data node and a second inverter coupled at an input terminal to the inverse data node and at an output terminal to the data node.

13. The method of claim 12, wherein:

the first inverter comprises a first pmos transistor and a first nmos transistor and the second inverter comprises a second pmos transistor and a second nmos transistor;

and the sizes of the first nmos and pmos transistors and second nmos and pmos transistors are selected to reduce read/write access time and to enhance data integrity in the memory cell.

14. The method of claim 12, wherein:

the first inverter comprises a first pmos transistor and a first nmos transistor and the second inverter comprises a second pmos transistor and a second nmos transistor;

the first pmos transistor and the first nmos transistor are sized to be very weak feedback transistors to enhance the stability of cell data during a read operation;

the second pmos transistor is sized to be weak so that, during step (a), it can pull the first node to logic-1 but does not oppose a logic-0 to be written to the data line; and the second nmos transistor is sized to be a strong device to reduce data line discharge time during a read operation.

15. The method of claim 9, comprising the step of operating the memory cell with a supply voltage $\leq 0.9$V.

16. The method of claim 9, wherein the logic-0 voltage source is one of ground and $V_{SS}$.

17. An integrated circuit having an array of memory cells, each for storing a data bit corresponding to one of a low and a high voltage, each memory cell comprising:

(a) a memory element coupled to a data node for storing the data bit and to an inverse data node for storing an inverse of the data bit;

(b) a single-ended, bidirectional access port comprising only one access switch having a first terminal coupled to a data line, a second terminal coupled to the data node, and a control terminal coupled to an access control line which provides an access control signal for switching the access switch on or off to selectively couple the data line to the data node to either write a write-data bit to the memory cell, during a cell write phase, or to read a read-data bit from the memory cell, during a cell read phase; and (c) a preset switch having a first terminal coupled to one of the data node and the inverse data node, a second terminal coupled to one of a logic-1 voltage source and a logic-0 voltage source, respectively, and a preset control terminal coupled to a preset control line which provides a write preset control signal that switches the preset switch on to couple the first terminal of the preset switch to the second terminal of the preset switch, during a cell pre-write phase prior to each said cell write phase, to precharge the data node to the high voltage;

the integrated circuit further comprising memory control logic for generating the write preset control signal during a cell pre-write phase prior to each cell write phase and for providing an access control signal to the access control line during said cell write phase to switch on the access switch to write the write-data bit to the precharged data node.

18. The integrated circuit of claim 1, wherein the first terminal of the preset switch is coupled to the inverse data node and the second terminal of the preset switch is coupled to a logic-0 voltage source.

19. The integrated circuit of claim 1, wherein the memory element comprises a first inverter coupled at an input terminal to the data node and at an output terminal to the inverse data node and a second inverter coupled at an input terminal to the inverse data node and at an output terminal to the data node.

20. The integrated circuit of claim 1, wherein the memory cell operates using a logic-1 voltage $\leq 0.9$V.

* * * * *